(12) United States Patent
Horiguchi

(10) Patent No.: US 8,330,331 B2
(45) Date of Patent: Dec. 11, 2012

(54) PIEZOELECTRIC POWER GENERATOR

(75) Inventor: Chikahiro Horiguchi, Nagaokakyo (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 0 days.

(21) Appl. No.: 13/151,655

(22) Filed: Jun. 2, 2011

(65) Prior Publication Data

US 2011/0227456 A1    Sep. 22, 2011

Related U.S. Application Data

(63) Continuation of application No. PCT/JP2009/006797, filed on Dec. 11, 2009.

(30) Foreign Application Priority Data

Dec. 12, 2008    (JP) .................................. 2008-317126

(51) Int. Cl.
*H01L 41/08* (2006.01)
(52) U.S. Cl. ....................................... 310/330
(58) Field of Classification Search .................. 310/328, 310/329, 339
See application file for complete search history.

(56) References Cited

U.S. PATENT DOCUMENTS

| | | | | |
|---|---|---|---|---|
| 3,976,899 A | * | 8/1976 | Fanshawe | 310/339 |
| 4,761,582 A | * | 8/1988 | McKee | 310/322 |
| 5,216,316 A | * | 6/1993 | Ipcinski | 310/338 |
| 5,266,863 A | * | 11/1993 | Nonami et al. | 310/339 |
| 5,636,729 A | * | 6/1997 | Wiciel | 200/181 |
| 2005/0073221 A1 | * | 4/2005 | Albsmeier et al. | 310/339 |

FOREIGN PATENT DOCUMENTS

| | | |
|---|---|---|
| JP | 3170965 | 3/2001 |
| JP | 2004-032929 A | 1/2004 |
| JP | 2006-216898 A | 8/2006 |
| JP | 2007-282355 A | 10/2007 |
| JP | 2008-054450 A | 3/2008 |

OTHER PUBLICATIONS

PCT/JP2009/006797 International Search Report dated May 3, 2010.
PCT/JP2009/006797 Written Opinion dated May 3, 2010.

* cited by examiner

*Primary Examiner* — Mark Budd
(74) *Attorney, Agent, or Firm* — Dickstein Shapiro LLP

(57) ABSTRACT

A piezoelectric power generator that performs conversion between kinetic energy and electrical energy. The piezoelectric power generator is equipped with a beam, a piezoelectric element and a flexible body. The piezoelectric element is bonded to a surface on one side of the beam. The flexible body is arranged on a side of the beam that is opposite to that on which the piezoelectric element is provided. A portion of the beam is connected to the flexible body. The beam is configured such that stress is applied to the beam when the flexible body is deformed into a concave shape with respect to the beam, whereas a stress is not applied to the beam when the flexible body is deformed into a convex shape with respect to the beam.

18 Claims, 7 Drawing Sheets

FIG. 16
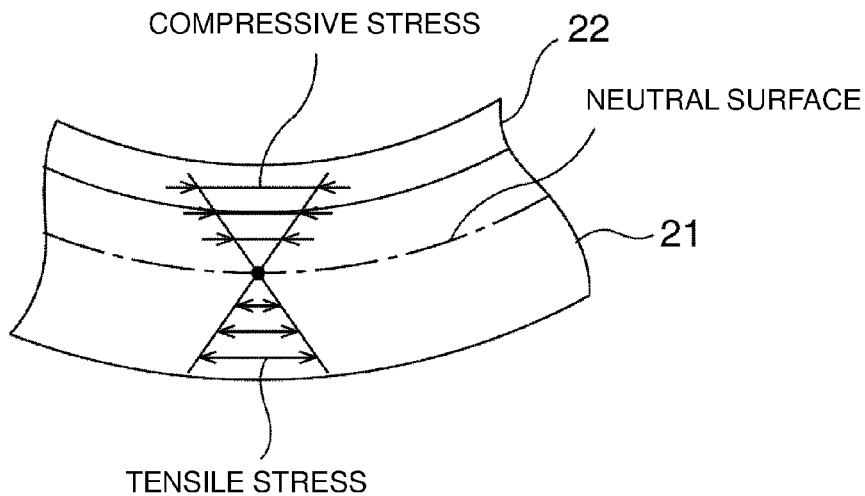
FIG. 17
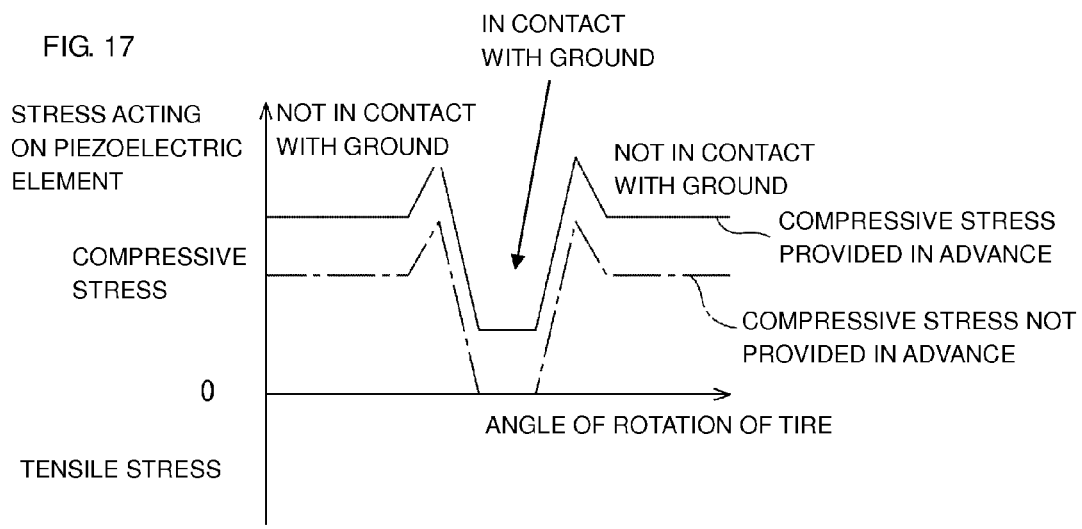
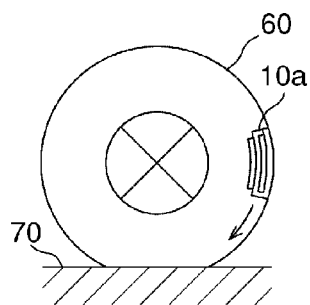
FIG. 18(a)
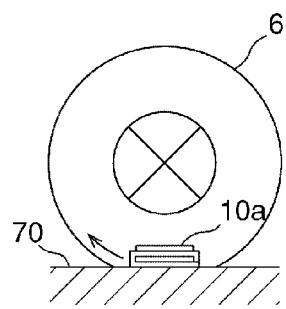
FIG. 18(b)
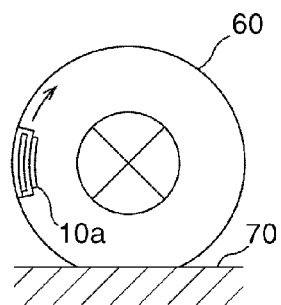
FIG. 18(c)

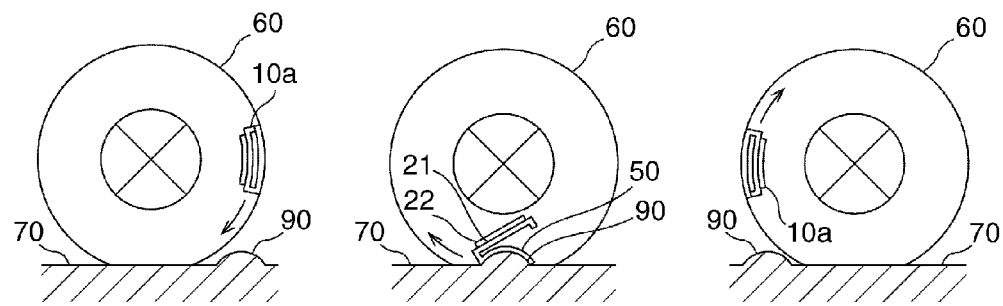
FIG. 19(a)  FIG. 19(b)  FIG. 19(c)
FIG. 20
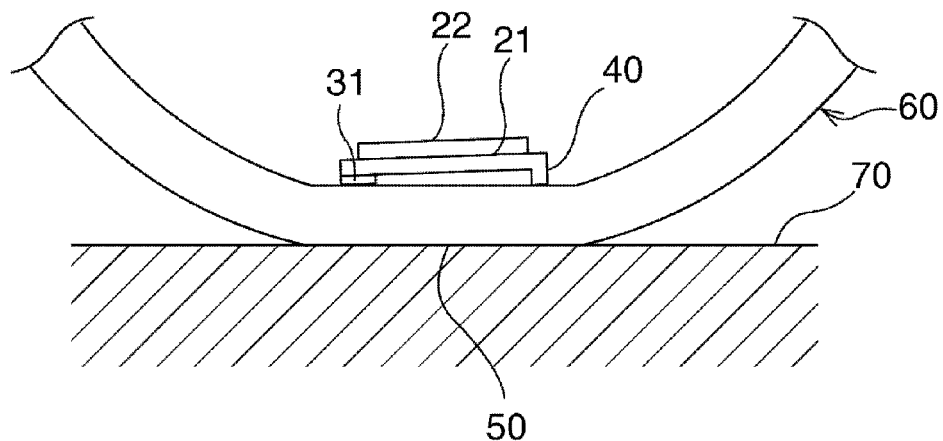
FIG. 21
PRIOR ART
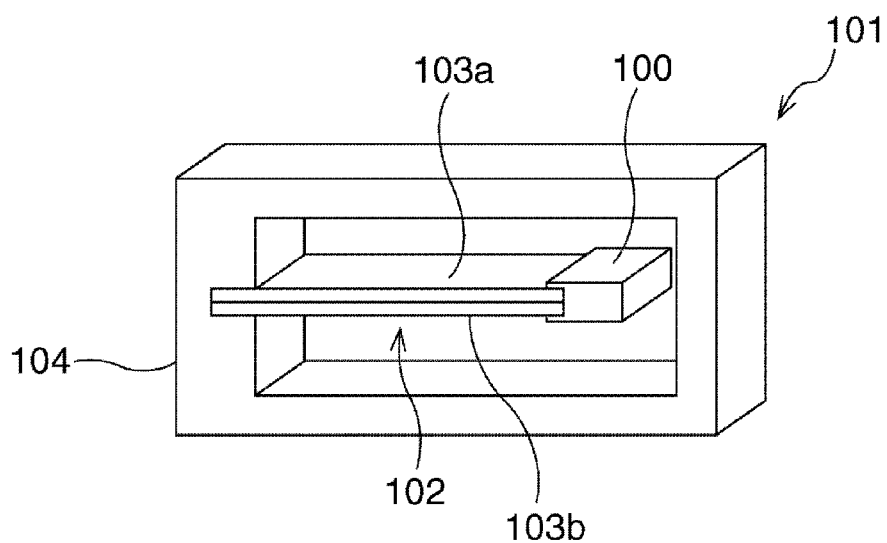

PIEZOELECTRIC POWER GENERATOR

CROSS REFERENCE TO RELATED APPLICATIONS

The present application is a continuation of International Application No. PCT/JP2009/006797, filed Dec. 11, 2009, which claims priority to Japanese Patent Application No. JP2008-317126, filed Dec. 12, 2008, the entire contents of each of these applications being incorporated herein by reference in their entirety.

FIELD OF THE INVENTION

The present invention relates to piezoelectric power generators and in particular relates to piezoelectric power generators that generate electrical power by converting kinetic energy into electrical energy.

BACKGROUND OF THE INVENTION

To date, a variety of piezoelectric power generators have been proposed that employ piezoelectric elements. For example, a piezoelectric power generator 101, which is illustrated in FIG. 21, is disclosed in below-cited Patent Literature 1.

The piezoelectric power generator 101 is equipped with a piezoelectric power-generating element 102. The piezoelectric power-generating element 102 is a cantilever beam, an end on one side of which is a fixed end, which is fixed to a support member 104, and an end on the other side of which is a free end. The piezoelectric power-generating element 102 is equipped with two piezoelectric elements 103a and 103b, which are bonded into a single body and vibrate freely, and a weight 100, which is bonded to portions of the piezoelectric elements 103a and 103b on the free end sides thereof.

In the piezoelectric power generator 101, stress is applied to the piezoelectric elements 103a and 103b as a result of the piezoelectric power-generating element 102 vibrating. As a result, electrical power is generated.

Patent Literature 1: Japanese Patent No. 3170965

However, in the piezoelectric power generator 101, reversed stress including tensile stress and compressive stress alternately act on the piezoelectric elements 103a and 103b in accordance with the acceleration acting on the weight 100. Consequently, cracks are easily generated in the piezoelectric elements 103a and 103b, which are vulnerable to tensile stress. Therefore, the mechanical reliability of the piezoelectric power generator 101 has been low.

SUMMARY OF THE INVENTION

In response to these problems of the prior art, an object of the present invention is to provide a piezoelectric power generator that has high mechanical reliability.

A piezoelectric power generator according to the present invention is a piezoelectric power generator that performs conversion between kinetic energy and electrical energy. The piezoelectric power generator according to the present invention is equipped with a beam, a piezoelectric element and a flexible body. The piezoelectric element is bonded to a surface on one side of the beam. The flexible body is arranged on a side of the beam that is opposite to that on which the piezoelectric element is provided. A portion of the beam is connected to the flexible body. The beam is provided in such a manner that stress is applied to the beam when the flexible body is deformed into a shape that is concave with respect to the beam, whereas stress is not applied to the beam when the flexible body is deformed into a shape that is convex with respect to the beam.

In a certain specific aspect of the piezoelectric power generator according to the present invention, the piezoelectric element is provided on the side of the neutral surface of the beam that is opposite to that on which the flexible body is provided.

In another specific aspect of the piezoelectric power generator according to the present invention, the piezoelectric element includes a piezoelectric substrate composed of a piezoelectric material.

In another specific aspect of the piezoelectric power generator according to the present invention, the piezoelectric substrate is composed of a piezoelectric ceramic.

In another specific aspect of the piezoelectric power generator according to the present invention, the piezoelectric power generator is further equipped with a connecting portion that connects the flexible body and the beam.

In another specific aspect of the piezoelectric power generator according to the present invention, the connecting portion has elasticity.

In another specific aspect of the piezoelectric power generator according to the present invention, the piezoelectric power generator is further equipped with a stress-applying portion that is provided on the beam or the flexible body and provides the beam with a stress when the flexible body is deformed into a shape that is concave with respect to the beam.

In another specific aspect of the piezoelectric power generator according to the present invention, the stress-applying portion is provided so as to protrude from the beam toward the flexible body.

In another specific aspect of the piezoelectric power generator according to the present invention, the stress-applying portion is provided so as to protrude from the flexible body toward the beam.

In another specific aspect of the piezoelectric power generator according to the present invention, the stress-applying portion has elasticity.

In another specific aspect of the piezoelectric power generator according to the present invention, the flexible body is a flexible plate that is parallel to the beam.

In another specific aspect of the piezoelectric power generator according to the present invention, the beam is a rectangular plate-shaped body.

In another specific aspect of the piezoelectric power generator according to the present invention, the flexible body is formed of part of a tire.

In another specific aspect of the piezoelectric power generator according to the present invention, the piezoelectric power generator is equipped with a plurality of the piezoelectric elements.

In the present invention, the beam is provided in such a manner that a stress is applied to the beam when the flexible body is deformed into a shape that is concave with respect to the beam, whereas a stress is not applied to the beam when the flexible body is deformed into a shape that is convex with respect to the beam. Thus, the application of tensile stress to the piezoelectric element can be suppressed. Therefore, the piezoelectric element is not likely to be damaged. Therefore, high mechanical reliability can be realized.

BRIEF DESCRIPTION OF THE DRAWINGS

FIG. 16 is a schematic view illustrating the stress distribution and the neutral surface in a portion of the beam and the piezoelectric element when the beam undergoes simple bending.

FIG. 17 is a graph illustrating the relationship between the angle of rotation of the tire and the stress acting on the piezoelectric element.

FIGS. 18 (a) to 18(c) are schematic diagrams illustrating the tire in a traveling state.

FIGS. 19 (a) to 19(c) are schematic diagrams illustrating the tire in a case where the tire is traveling on a road on which there is an obstacle.

FIG. 20 is a schematic side view of a piezoelectric power generator according to a tenth modification.

FIG. 21 is a schematic perspective view of a piezoelectric power generator described in Patent Literature 1.

DETAILED DESCRIPTION OF THE INVENTION

Hereafter, specific embodiments of the present invention will be described with reference to the drawings in order to make the present invention clear.

First Embodiment

Figure 1:
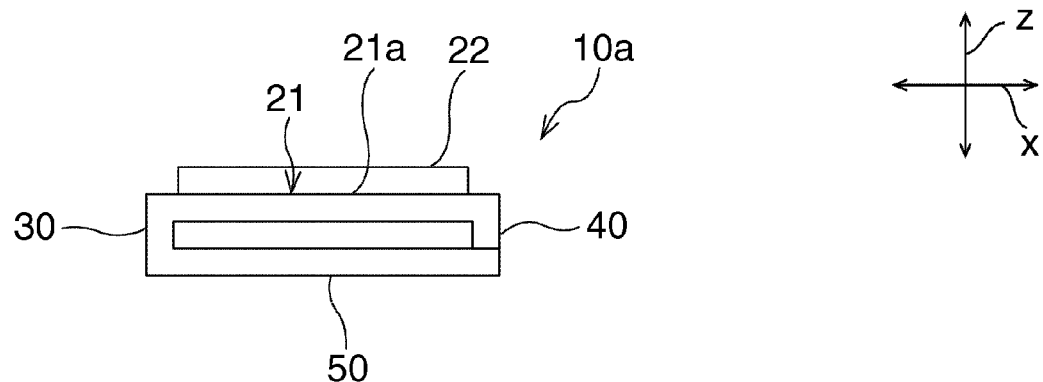
FIG. 1 is a schematic side view of a piezoelectric power generator according to a first embodiment.

FIG. 1 is a schematic side view of piezoelectric power generator 10a according to a first embodiment. The piezoelectric power generator 10a illustrated in FIG. 1 is a device for converting kinetic energy into electrical energy. The piezoelectric power generator 10a is for example arranged inside a tire of an automobile and is suitably used as the power source of a tire air pressure measurement sensor or the like. However, uses of a piezoelectric power generator according to the present invention are not limited to this. A piezoelectric power generator according to the present invention can be attached to devices or the like that deform together with the piezoelectric power generator and can be used as the power source of a variety of devices in addition to that of a tire air pressure measurement sensor.

As illustrated in FIG. 1, the piezoelectric power generator 10a is equipped with a beam 21. In this embodiment, the beam 21 is a rectangular plate-shaped body. However, in the present invention, the shape of the beam is not especially limited. The beam, for example, may have a polygonal column shape, a cylindrical shape, a polyhedral cone shape or a U shape.

The beam 21 is an elastic body having elasticity. Specifically, the beam 21 can be for example formed of a metal such as iron, copper or aluminum, an alloy such as stainless steel or duralumin, or a plastic.

A piezoelectric element 22 is bonded onto a surface 21a on one side of the beam 21. The method of bonding the piezoelectric element 22 to the beam 21 is not especially limited and for example an adhesive or the like can be used to bond the piezoelectric element 22 to the beam 21.

In this embodiment, the piezoelectric element 22 is provided on the neutral surface side of the beam 21 that is opposite to that on which a flexible body 50 is provided. Here, the term "neutral surface" refers to a surface whose length does not change in a pure bending state. The term "pure bending state" refers to a state in which the shearing force is zero and only the bending moment is acting.

The neutral surface of the beam 21 is not necessarily flat in a state where no external forces are acting on the piezoelectric power generator 10a.

Figure 2:
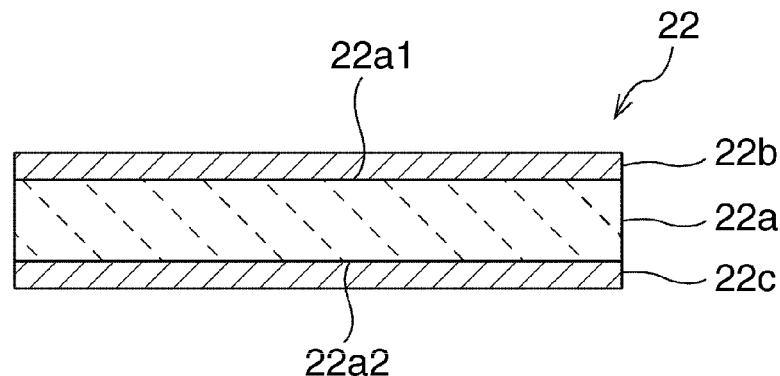
FIG. 2 is a schematic sectional view of a piezoelectric element.

FIG. 2 is a schematic sectional view of the piezoelectric element 22. As illustrated in FIG. 2, the piezoelectric element 22 includes a piezoelectric substrate 22a and first and second electrodes 22b and 22c.

The piezoelectric substrate 22a is composed of a piezoelectric material. Specific examples of piezoelectric materials include, for example, piezoelectric ceramics such as lead zirconate titanate (PZT) and the like. The piezoelectric substrate 22a may be for example formed of $LiTaO_3$, $LiNbO_3$ or quartz, but it is preferable that the piezoelectric substrate 22a be formed of PZT, which has a high electromechanical coupling coefficient.

The first electrode 22b is provided on a surface 22a1 on one side of the piezoelectric substrate 22a. The second electrode 22c is provided on a surface 22a2 on the other side of the piezoelectric substrate 22a. The first and second electrodes 22b and 22c are electrodes for taking out a voltage generated by the piezoelectric substrate 22a.

So long as the material used to form the first and second electrodes 22b and 22c is a conductive material, the material is not especially limited. Each of the first and second electrodes 22b and 22c can for example be formed of a metal such as Ag, Cu, Au, Pt, Ni or Cr, or an alloy containing at least one of these metals such as a Ag—Pd alloy or a Ni—Cr alloy.

As illustrated in FIG. 1, the flexible body 50 is arranged on a side of the beam 21 that is opposite to that on which the piezoelectric element 22 is provided. The flexible body 50 is a flexible plate, which is parallel to the beam 21. The flexible body 50 is composed of an elastic body that elastically deforms when subjected to a stress. Specifically, the flexible body 50 can be for example formed of a metal, an alloy or a plastic.

Part of the flexible body 50 and part of the beam 21 are connected to each other. Specifically, in this embodiment, an end portion on one side of the flexible body 50 and an end portion on one side of the beam 21 are connected to each other, the end portions being located on a side in a direction x, which is orthogonal to a direction in which the flexible body 50 deforms, which is the same as a direction z that is normal to the surfaces of the beam 21 and the flexible body 50. More specifically, in this embodiment, an end portion on one side of the flexible body 50 and an end portion on one side of the beam 21 are connected to each other through a connecting portion 30.

The connecting portion 30 preferably possesses elasticity. Specifically, the connecting portion 30 can be for example formed of a metal, an alloy or a plastic.

Furthermore, a stress-applying portion 40 is provided in the piezoelectric power generator 10a. In this embodiment, the stress-applying portion 40 is provided on the beam 21. That is, the stress-applying portion 40 is connected to the beam 21. Specifically, the stress-applying portion 40 is connected to an end portion of the beam 21 on the opposite side to the side of the connecting portion 30 in the x direction. The stress-applying portion 40 extends in the z direction from the beam 21. That is, the stress-applying portion 40 is provided so as to protrude from the beam 21 toward the flexible body 50. As will be described in detail below, the stress-applying portion 40 applies stress to the beam 21 when the flexible body 50 is deformed into a shape that is concave with respect to the beam 21 and does not apply stress to the beam 21 when the flexible body 50 is deformed into a shape that is convex with respect to the beam 21.

The stress-applying portion 40 preferably possesses elasticity. Specifically, the stress-applying portion 40 can be for example formed of a metal, an alloy, a plastic or a rubber.

In this embodiment, the beam 21, the flexible body 50, the connecting portion 30 and the stress-applying portion 40 are formed from a single elastic plate. However, in the present invention, the beam, the flexible body, the connecting portion and the stress-applying portion are not necessarily formed as a single body. For example, the beam, the flexible body, the connecting portion and the stress-applying portion may be formed of a plurality of members.

Next, with reference to FIG. 3 and FIG. 4, the way in which electrical power is generated by the piezoelectric power generator 10a according to this embodiment will be described in detail.

Figure 3:
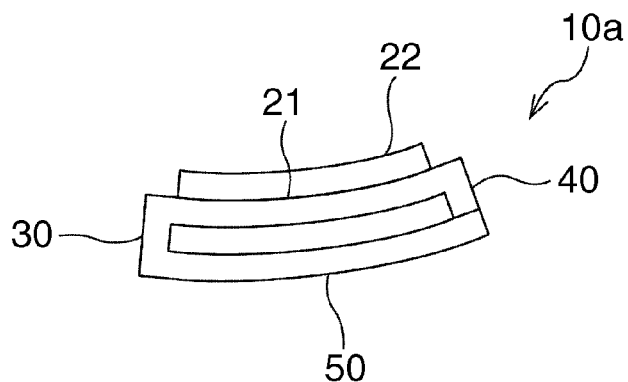
FIG. 3 is a schematic side view illustrating the piezoelectric power generator when a flexible body is deformed into a shape that is concave with respect to a beam.

As illustrated in FIG. 3, in the case where an external force acts on the flexible body 50 and the flexible body 50 is deformed into a shape that is concave with respect to the beam 21, a stress is applied to the beam 21 by the stress-applying portion 40. Thus, similarly to the flexible body 50, the beam 21 is also concavely deformed. Consequently, the piezoelectric substrate 22a of the piezoelectric element 22 is subjected to compressive stress. As a result, electrical power is generated in the piezoelectric substrate 22a. This electrical power is taken out by the first and second electrodes 22b and 22c.

Figure 4:
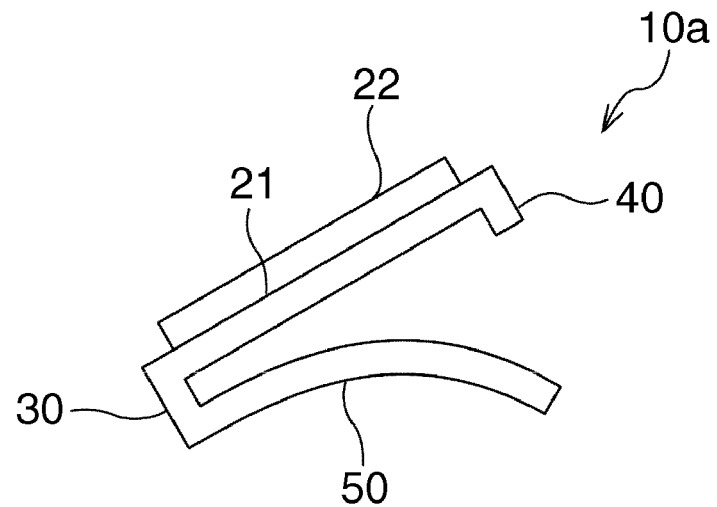
FIG. 4 is a schematic side view illustrating the piezoelectric power generator when the flexible body is deformed into a shape that is convex with respect to the beam.

In contrast, as illustrated in FIG. 4, in the case where an external force acts on the flexible body 50 and the flexible body 50 is deformed into a shape that is convex with respect to the beam 21, since the stress-applying portion 40 is not fixed to the flexible body 50, the stress-applying portion 40 and the flexible body 50 separate from each other. Accordingly, substantially no stress is applied to the beam 21 and the piezoelectric element 22, which is bonded to the beam 21. Consequently, also in the case where an external force acts on the flexible body 50 and the flexible body 50 is deformed into a shape that is convex with respect to the beam 21, it is unlikely that a tensile stress will be applied to the piezoelectric substrate 22a of the piezoelectric element 22.

Thus, in the piezoelectric power generator 10a of this embodiment, a compressive stress is applied to the piezoelectric element 22 and thereby electrical power is generated and applying of a tensile stress to the piezoelectric element 22 is suppressed. Therefore, damaging of the piezoelectric element 22, which is easily damaged by tensile stress, can be effectively suppressed. As a result, the piezoelectric power generator 10a having high mechanical reliability can be realized.

Hereafter, other preferable embodiments of carrying out the present invention and modifications thereto will be described. In the following description, components having substantially the same functions as those of the first embodiment are referred to using the same symbols and description thereof is omitted.

(First Modification)

Figure 5:
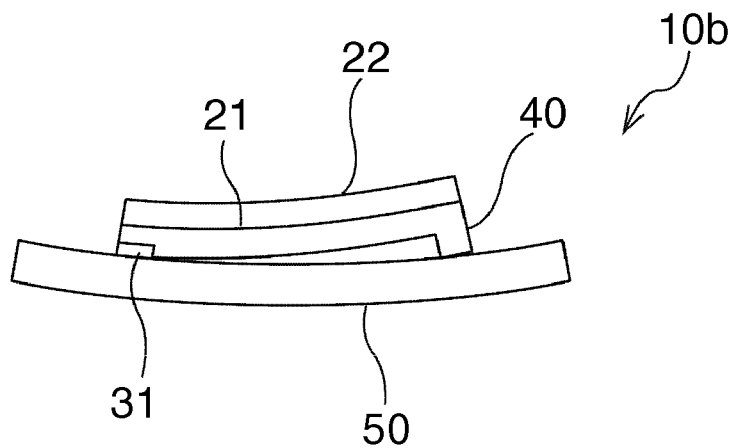
FIG. 5 is a schematic side view of a piezoelectric power generator according to a first modification.

FIG. 5 is a schematic side view of a piezoelectric power generator 10b according to a first modification of the first embodiment.

In the first embodiment, an example was described in which the beam 21 and the flexible body 50 are connected to each other through the connecting portion 30. However, the present invention is not limited to this configuration. For example, as illustrated in FIG. 5, the beam 21 and the flexible body 50 may be directly connected to each other through adhesive 31. In the case illustrated in FIG. 5, compressive stress is applied to the piezoelectric element 22 when driving is not being performed and applying of tensile stress to the piezoelectric element 22 can be more effectively suppressed.

In the case of directly bonding the beam 21 and the flexible body 50 to each other, the method with which the beam 21 and the flexible body 50 are bonded to each other is not especially limited. For example, as described above, the beam 21 and the flexible body 50 may be bonded to each other through an adhesive or the beam 21 and the flexible body 50 may be bonded to each other trough welding or the like.

Furthermore, in the first embodiment, an example was described in which the beam 21, the flexible body 50, the connecting portion 30 and the stress-applying portion 40 are formed from a single elastic plate. However, the present invention is not limited to this configuration. For example, as illustrated in FIG. 5, the beam 21 and the stress-applying portion 40, and the flexible body 50 may be formed as separate members.

Furthermore, in the first embodiment, an example was described in which the flexible body 50 has a flat plate-like shape. However, the present invention is not limited to this configuration. For example, the flexible body 50 may be curved as illustrated in FIG. 5.

(Second Modification)

Figure 6:
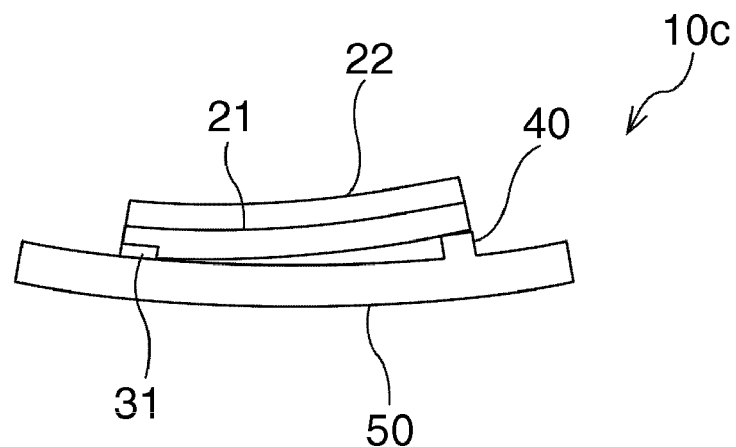
FIG. 6 is a schematic side view of a piezoelectric power generator according to a second modification.

FIG. 6 is a schematic side view of a piezoelectric power generator 10c according to a second modification of the first embodiment.

In the first embodiment and the first modification, cases were described in which the stress-applying portion 40 is provided on the beam 21. However, the present invention is not limited to this configuration. For example, as illustrated in FIG. 6, the stress-applying portion 40 may be formed so as to be integrated with the flexible body 50. In the piezoelectric power generator 10c illustrated in FIG. 6, the stress-applying portion 40 is provided so as to protrude from the flexible body 50 toward the beam 21. In this case, the degree of freedom in selecting the material of the beam 21 is increased.

(Third Modification)

Figure 7:
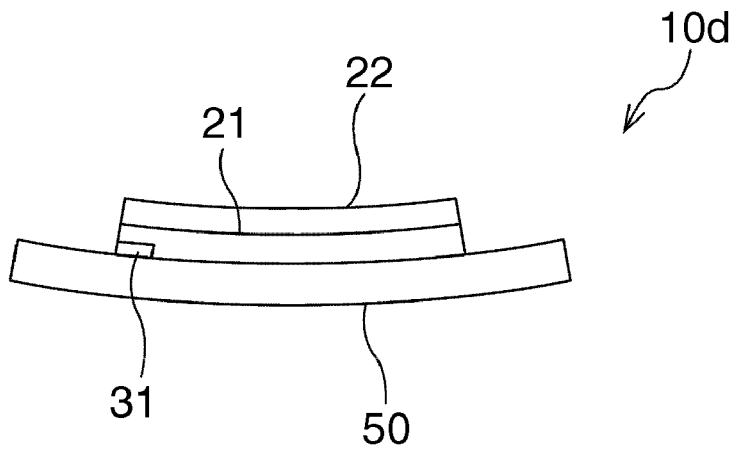
FIG. 7 is a schematic side view of a piezoelectric power generator according to a third modification.

FIG. 7 is a schematic side view of a piezoelectric power generator 10d according to a third modification of the first embodiment.

In the first embodiment and the first and second modifications, examples were described in which the stress-applying portion 40 is provided along with the flexible body 50 and the beam 21. However, in the present invention, the stress-applying portion is not an essential structure. For example, as illustrated in FIG. 7, the stress-applying portion 40 need not be provided. In the piezoelectric power generator 10d illustrated in FIG. 7, when the flexible body 50 is deformed into a shape that is concave with respect to the beam 21, the flexible body 50 directly applies a stress to the beam 21. Thus, the beam 21 is deformed. That is, in this modification, the flexible body 50 also functions as the stress-applying portion.

(Fourth and Fifth Modifications)

Figure 8:
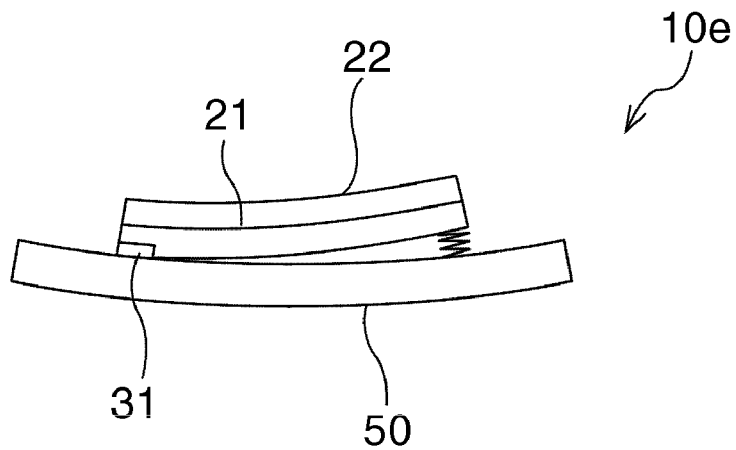
FIG. 8 is a schematic side view of a piezoelectric power generator according to a fourth modification.
Figure 9:
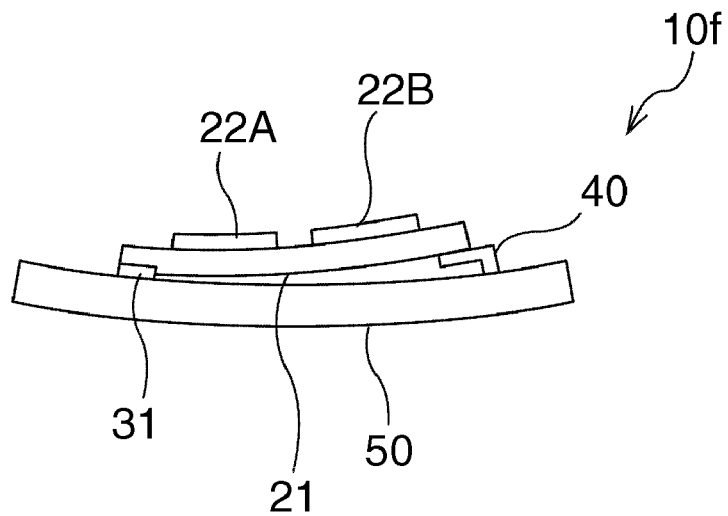
FIG. 9 is a schematic side view of a piezoelectric power generator according to a fifth modification.

FIG. 8 is a schematic side view of a piezoelectric power generator 10e according to a fourth modification of the first embodiment. FIG. 9 is a schematic side view of a piezoelectric power generator 10f according to a fifth modification of the first embodiment.

In the first embodiment and the first and second modifications, examples were described in which the stress-applying portion 40 is a rectangular parallelepiped composed of a metal or the like. However, the present invention is not limited to this configuration. For example, as illustrated in FIG. 8 and FIG. 9, the stress-applying portion 40 may be formed of a spring. Specifically, in the piezoelectric power generator 10e illustrated in FIG. 8, the stress-applying portion 40 is formed of a coil spring. In the piezoelectric power generator 10f illustrated in FIG. 9, the stress-applying portion 40 is formed of a leaf spring. In these cases, it is possible to effectively suppress application of an impact load to the beam 21 and the piezoelectric element 22. Therefore, the piezoelectric power generator 10e having higher mechanical reliability can be realized.

Furthermore, in the first embodiment, an example was described in which only a single piezoelectric element 22 is provided. However, the present invention is not limited to this configuration. For example, as illustrated in FIG. 9, a plurality of piezoelectric elements 22A and 22B may be provided on the beam 21. Thus, in the case in which the plurality of piezoelectric elements 22A and 22B are provided, the electrical power characteristics of the piezoelectric power generator 10f can be altered by changing the electrical coupling between the plurality of piezoelectric elements 22A and 22B.

In this modification, an example was described in which the plurality of piezoelectric elements 22A and 22B are arranged in parallel on the beam 21. However, the present invention is not limited to this configuration. For example, a plurality of piezoelectric substrates may be stacked on top of one another on the beam.

Second Embodiment

Figure 10:
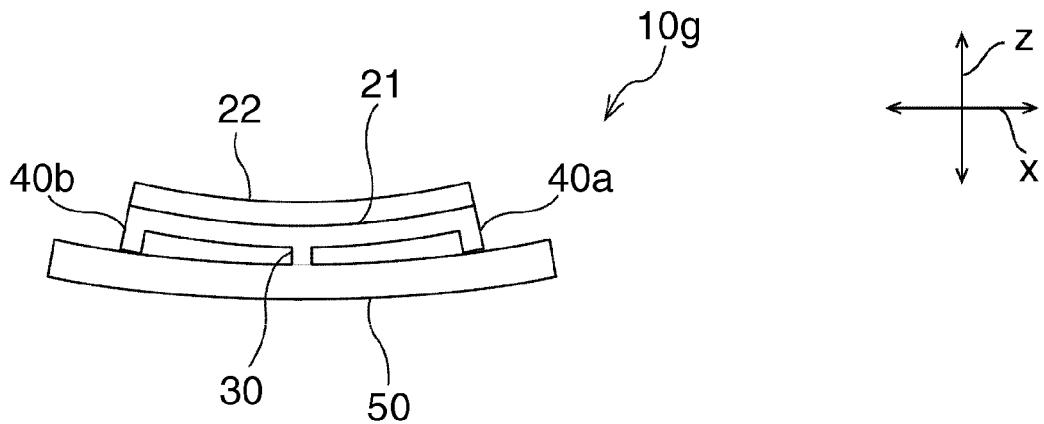
FIG. 10 is a schematic side view of a piezoelectric power generator according to a second embodiment.

FIG. 10 is a schematic side view of a piezoelectric power generator 10g according to a second embodiment.

In the first embodiment, an example was described in which the connecting portion 30 connects an end portion on one side of the beam 21 in the x direction and an end portion on one side of the flexible body 50 in the x direction and in which the stress-applying portion 40 is provided on an end portion on the other side of the beam 21 in the x direction. However, the present invention is not limited to this configuration.

As illustrated in FIG. 10, in the piezoelectric power generator 10g according to this embodiment, the connecting portion 30 connects a central portion of the beam 21 in the x direction and the flexible body 50. Stress-applying portions 40a and 40b are provided on either end portion of the beam 21 in the x direction.

In the piezoelectric power generator 10g of this embodiment, similarly to as in the piezoelectric power generator 10a of the first embodiment, it is not likely that tensile stress will act on the piezoelectric element 22. Therefore, high mechanical reliability can be realized.

(Sixth to Ninth Modifications)

Figure 11:
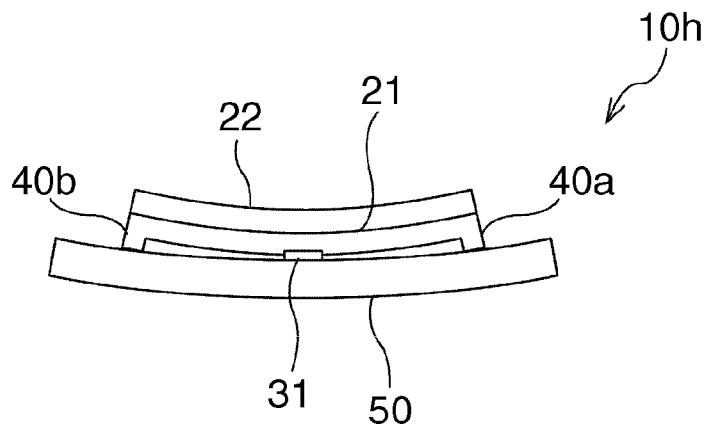
FIG. 11 is a schematic side view of a piezoelectric power generator according to a sixth modification.

FIG. 11 is a schematic side view of a piezoelectric power generator 10h according to a sixth modification, which is a modification of the second embodiment.

In the second embodiment, an example was described in which the beam 21 and the flexible body 50 are connected to each other through the connecting portion 30. However, the present invention is not limited to this configuration. For example, as illustrated in FIG. 11, the beam 21 and the flexible body 50 may be directly connected to each other though the adhesive 31.

Figure 12:
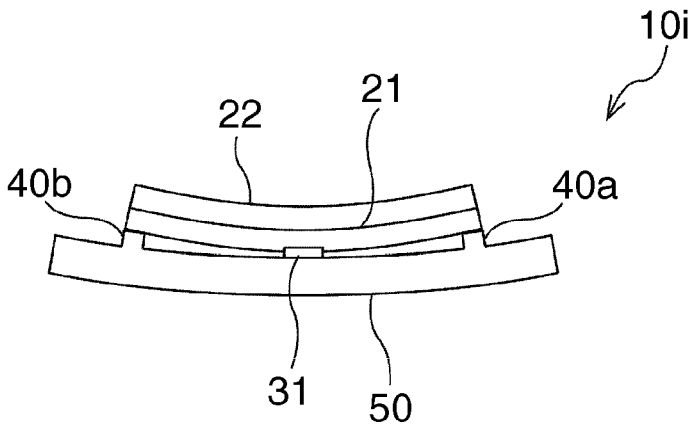
FIG. 12 is a schematic side view of a piezoelectric power generator according to a seventh modification.

FIG. 12 is a schematic side view of a piezoelectric power generator 10i according to a seventh modification, which is a modification of the second embodiment. As illustrated in FIG. 12, the stress-applying portions 40a and 40b may be provided so as to protrude from the flexible body 50 toward the beam 21.

Figure 13:
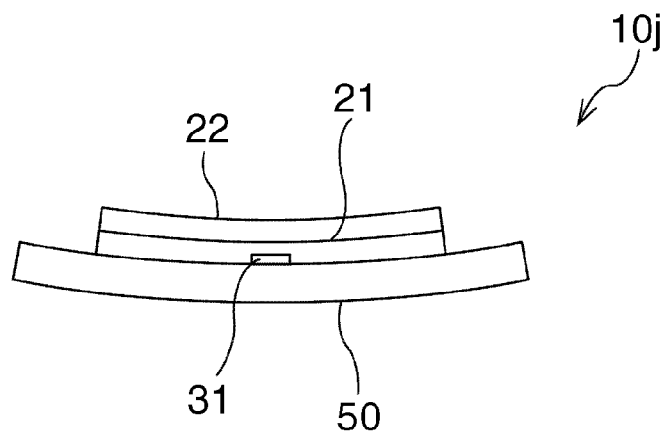
FIG. 13 is a schematic side view of a piezoelectric power generator according to an eighth modification.

FIG. 13 is a schematic side view of a piezoelectric power generator 10j according to an eighth modification, which is a modification of the second embodiment. As illustrated in FIG. 13, a stress-applying portion need not be provided.

Figure 14:
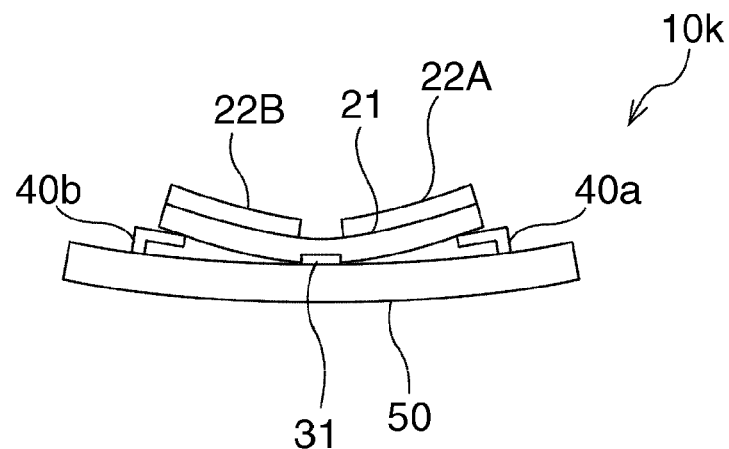
FIG. 14 is a schematic side view of a piezoelectric power generator according to a ninth modification.

FIG. 14 is a schematic side view of a piezoelectric power generator 10k according to a ninth modification, which is a modification of the second embodiment. As illustrated in FIG. 14, the stress-applying portions 40a and 40b may be for example formed of springs. Furthermore, a plurality of the piezoelectric elements 22A and 22B may be provided.

(Way in which Piezoelectric Power Generator is Used)

Figure 15:
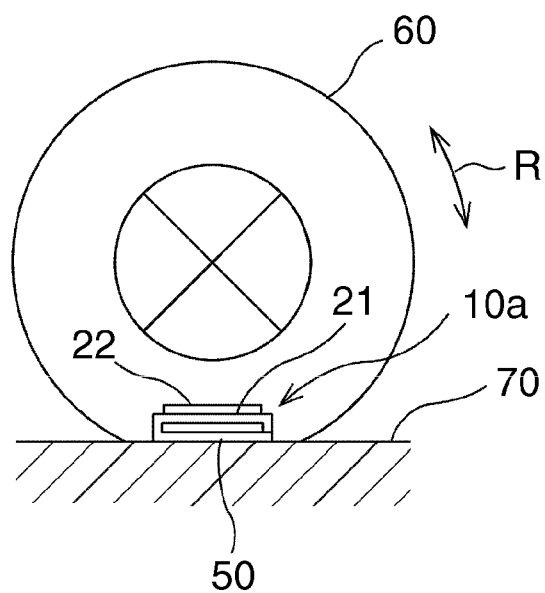
FIG. 15 is a schematic side view illustrating the way in which the piezoelectric power generator according to the first embodiment is used.

FIG. 15 is a schematic side view illustrating the way in which the piezoelectric power generator according to the first embodiment is used.

Here, the way in which the piezoelectric power generator according to the first embodiment is used will be described as an example of a way in which a piezoelectric power generator, in which the present invention has been implemented, is used.

As illustrated in FIG. 15, the piezoelectric power generator 10a is for example used by being attached to the inner wall of a tire 60. In the example illustrated in FIG. 15, the piezoelectric power generator 10a is attached to the tire 60 in such a manner that the direction in which the neutral axis of the beam 21 extends and the direction of rotation R of the tire 60 are the same. However, the method of attaching the piezoelectric power generator 10a to the tire 60 is not especially limited. For example, the piezoelectric power generator 10a can be attached to the tire 60 by using an adhesive. Furthermore, the piezoelectric power generator 10a can be attached to the tire 60 by being molded into the tire 60 or by being welded to a metal wire in the tire 60.

FIG. 16 is a schematic view illustrating the stress distribution and the neutral surface in a portion of the beam 21 and piezoelectric element 22 when the beam 21 undergoes simple bending. FIG. 17 is a graph illustrating the relationship between the angle of rotation of the tire 60 and the stress acting on the piezoelectric element 22. FIGS. 18 (a) to 18(c) are schematic diagrams illustrating the tire in a traveling state. FIGS. 19 (a) to 19(c) are schematic diagrams illustrating the tire in a case where the tire is traveling on a road on which there is an obstacle.

Next, the electrical power generating operation of the piezoelectric power generator 10a being used in this way will be described with reference to FIGS. 16 to 19(c).

In a state in which a portion of the tire 60 where the piezoelectric power generator 10a is provided is not in contact with ground 70, as illustrated in FIG. 18(a), the flexible body 50, which is bonded to an inner circumferential surface of the tire 60 which is curved in the direction of rotation, is curved along the inner circumferential surface of the tire 60. Accordingly, the beam 21 and the piezoelectric element 22 are in a state of being convexly curved toward the ground 70. Therefore, as illustrated in FIG. 16 and FIG. 17, a state occurs in which a compressive stress is applied to the piezoelectric element 22.

Next, as illustrated in FIG. 18(b), in a state in which the portion of the tire 60 in which the piezoelectric power generator 10a is provided is in contact with the ground 70, the flexible body 50 takes on a substantially flat plate-like shape. Accordingly, as illustrated in FIG. 17, a state occurs in which either just a small compressive stress or no stress at all acts on the piezoelectric element 22.

Next, as illustrated in FIG. 18(c), when a state again occurs in which the portion of the tire 60 in which the piezoelectric power generator 10a is provided is not in contact with the ground 70, as illustrated in FIG. 17, a state occurs in which compressive stress is applied to the piezoelectric element 22.

Thus, the magnitude of the compressive stress acting on the piezoelectric element 22 varies in accordance with rotation of the tire 60. Thus, electrical power is generated. During this electrical power generating operation, as described above, in the piezoelectric power generator 10a, only compressive stress acts on the piezoelectric element 22 and it is not likely that tensile stress will act on the piezoelectric element 22. In particular, as illustrated in FIG. 17, in the case where the piezoelectric element 22 is provided with a compressive stress in advance by bending the beam 21 and the piezoelectric element 22, it is even less likely that a tensile stress will act on the piezoelectric element 22. Furthermore, as illustrated in FIG. 19(b), in the case where the tire 60 runs over the obstacle 90 on the ground 70 and the flexible body 50 is deformed into a shape that is convex with respect to the beam 21, the beam 21 and the piezoelectric element 22 are substantially not deformed. Thus, it is not likely that a tensile stress will act on the piezoelectric element 22. Therefore, damaging of the piezoelectric element 22, which is vulnerable to tensile stress, is effectively suppressed.

A method in which the piezoelectric element 22 is bonded to the beam 21 that is convexly bent away from the flexible body 50 is also given as an example of a method of applying a compressive stress to the piezoelectric element 22 in advance.

Here, an example was described in which the flexible body 50 is provided separately from the tire 60, which undergoes deformation. However, the present invention is not limited to this configuration. For example, as illustrated in FIG. 20, the flexible body may be formed of the tire 60. That is, the beam 21 may be connected to the inner circumferential surface of the tire 60.

REFERENCE NUMBER LIST 10a, 10b, 10c, 10d, 10e, 10f, 10g, 10h, 10i, 10j, 10k . . . piezoelectric power generator
21 . . . beam
21a . . . surface of beam
22, 22A, 22B . . . piezoelectric element
22a . . . piezoelectric substrate
22a1, 22a2 . . . surface of piezoelectric substrate
22b . . . first electrode
22c . . . second electrode
30 . . . connecting portion
31 . . . adhesive
40, 40a, 40b . . . stress-applying portion
50 . . . flexible body
60 . . . tire
70 . . . ground
90 . . . obstacle

The invention claimed is:

1. A piezoelectric power generator that performs conversion between kinetic energy and electrical energy, comprising
   a beam,
   a piezoelectric element on a first side of the beam, and
   a flexible body on a second side of the beam opposite to the first side on which the piezoelectric element is provided and to which a portion of the beam is connected,
   wherein the beam is arranged such that a stress is applied to the beam when the flexible body is deformed into a concave shape across an entire length of the beam with respect to the beam, and a stress is not applied to the beam when the flexible body is deformed into a convex shape across the entire length of the beam with respect to the beam.

2. The piezoelectric power generator according to claim 1, wherein the first side of the beam is a neutral surface side.

3. The piezoelectric power generator according to claim 1, wherein the piezoelectric element includes a piezoelectric substrate composed of a piezoelectric material.

4. The piezoelectric power generator according to claim 3, wherein the piezoelectric substrate is composed of a piezoelectric ceramic.

5. The piezoelectric power generator according to claim 1, further comprising a connecting portion that connects the flexible body and the beam.

6. The piezoelectric power generator according to claim 5, wherein the connecting portion has elasticity.

7. The piezoelectric power generator according to claim 1, further comprising a stress-applying portion that applies the stress to the beam when the flexible body is deformed into the concave shape.

8. The piezoelectric power generator according to claim 7, wherein the stress-applying portion is provided on the beam.

9. The piezoelectric power generator according to claim 7, wherein the stress-applying portion is provided on the flexible body.

10. The piezoelectric power generator according to claim 7, wherein the stress-applying portion is provided so as to protrude toward the flexible body from the beam.

11. The piezoelectric power generator according to claim 7, wherein the stress-applying portion is provided so as to protrude toward the beam from the flexible body.

12. The piezoelectric power generator according to claim 7, wherein the stress-applying portion has elasticity.

13. The piezoelectric power generator according to claim 7, wherein the stress-applying portion is a spring.

14. The piezoelectric power generator according to claim 1, wherein the flexible body is a flexible plate that is parallel to the beam.

15. The piezoelectric power generator according to claim 1, wherein the beam is a rectangular plate-shaped body.

16. The piezoelectric power generator according to claim 1, wherein the piezoelectric element comprises a plurality of piezoelectric elements.

17. The piezoelectric power generator according to claim 1, wherein the flexible body is curved.

18. The piezoelectric power generator according to claim 1, wherein the flexible body is part of a tire.

* * * * *